United States Patent
Nicolai et al.

(10) Patent No.: US 10,243,543 B2
(45) Date of Patent: Mar. 26, 2019

(54) PULSE COUNTING CIRCUIT

(71) Applicant: STMicroelectronics (Rousset) SAS, Rousset (FR)

(72) Inventors: Jean Nicolai, Chateauneuf le Rouge (FR); Albert Martinez, Bouc Bel Air (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 31 days.

(21) Appl. No.: 15/358,245

(22) Filed: Nov. 22, 2016

(65) Prior Publication Data

US 2017/0324403 A1    Nov. 9, 2017

(30) Foreign Application Priority Data

May 4, 2016   (FR) ...................................... 16 54078

(51) Int. Cl.
| | | |
|---|---|---|
| H03K 21/00 | (2006.01) | |
| H03K 3/84 | (2006.01) | |
| H03K 21/02 | (2006.01) | |
| H03K 23/00 | (2006.01) | |
| H03K 5/06 | (2006.01) | |
| H03K 19/003 | (2006.01) | |

(52) U.S. Cl.
CPC ................. *H03K 3/84* (2013.01); *H03K 5/06* (2013.01); *H03K 19/00323* (2013.01); *H03K 21/023* (2013.01); *H03K 23/004* (2013.01)

(58) Field of Classification Search
None
See application file for complete search history.

(56) References Cited

U.S. PATENT DOCUMENTS

| | | | |
|---|---|---|---|
| 4,253,181 A | 2/1981 | Watten | |
| 6,452,427 B1 | 9/2002 | Ko et al. | |
| 6,795,931 B1 | 9/2004 | LaBerge | |
| 6,928,129 B2 * | 8/2005 | Oka | ..................... H03C 3/0925 |
| | | | 375/376 |
| 8,930,428 B2 | 1/2015 | Yasuda et al. | |
| 9,531,354 B1 | 12/2016 | Sim | |
| 9,606,771 B2 * | 3/2017 | Mei | ......................... G06F 7/588 |
| 2003/0160630 A1 | 8/2003 | Earle | |
| 2004/0205095 A1 | 10/2004 | Gressel et al. | |

(Continued)

FOREIGN PATENT DOCUMENTS

FR    3023396 A1    1/2016

OTHER PUBLICATIONS

Hirotaka Kokubo et al: "Evaluation of ASIC Implementation of Physical Random Number Generators Using RS Latches," Lecture Notes in Computer Science, vol. 8419, Nov. 1, 2013, XP055184484 (13 pages).

(Continued)

*Primary Examiner* — Long Nguyen
(74) *Attorney, Agent, or Firm* — Crowe & Dunlevy

(57) ABSTRACT

A pulse counting circuit receives pulses supplied by a source circuit having at least two inverted pulse signal supply terminals. The circuit includes a first counter to count pulses of a first pulse signal and supply a first count and a second counter to count pulses of a second pulse signal and supply a second count. A selection circuit selects one of the first and second counts.

28 Claims, 6 Drawing Sheets

(56) References Cited

U.S. PATENT DOCUMENTS

| | | |
|---|---|---|
| 2007/0283184 A1* | 12/2007 | Hsu ..................... H04L 7/0338 |
| | | 713/501 |
| 2009/0106339 A1 | 4/2009 | Vasyltsov et al. |
| 2009/0172055 A1 | 7/2009 | Radja et al. |
| 2009/0177725 A1 | 7/2009 | Ikegami et al. |
| 2009/0206937 A1 | 8/2009 | Luzzi et al. |
| 2009/0307516 A1 | 12/2009 | Renaudin et al. |
| 2011/0131263 A1 | 6/2011 | Vasyltsov et al. |
| 2011/0163818 A1 | 7/2011 | Dichtl et al. |
| 2011/0298491 A1 | 12/2011 | Engels |
| 2011/0302471 A1 | 12/2011 | Le-Gall |
| 2014/0244702 A1 | 8/2014 | Karpinskyy et al. |
| 2015/0008763 A1 | 1/2015 | Kuenemund |
| 2015/0106415 A1* | 4/2015 | Mei ..................... H03K 3/84 |
| | | 708/251 |
| 2015/0154006 A1 | 6/2015 | Yang et al. |
| 2017/0324403 A1 | 11/2017 | Nicolai et al. |
| 2017/0324405 A1 | 11/2017 | Martinez et al. |
| 2017/0324409 A1 | 11/2017 | Martinez et al. |

OTHER PUBLICATIONS

INPI Search Report and Written Opinion for FR 1654078 dated Feb. 21, 2017 (9 pages).

* cited by examiner

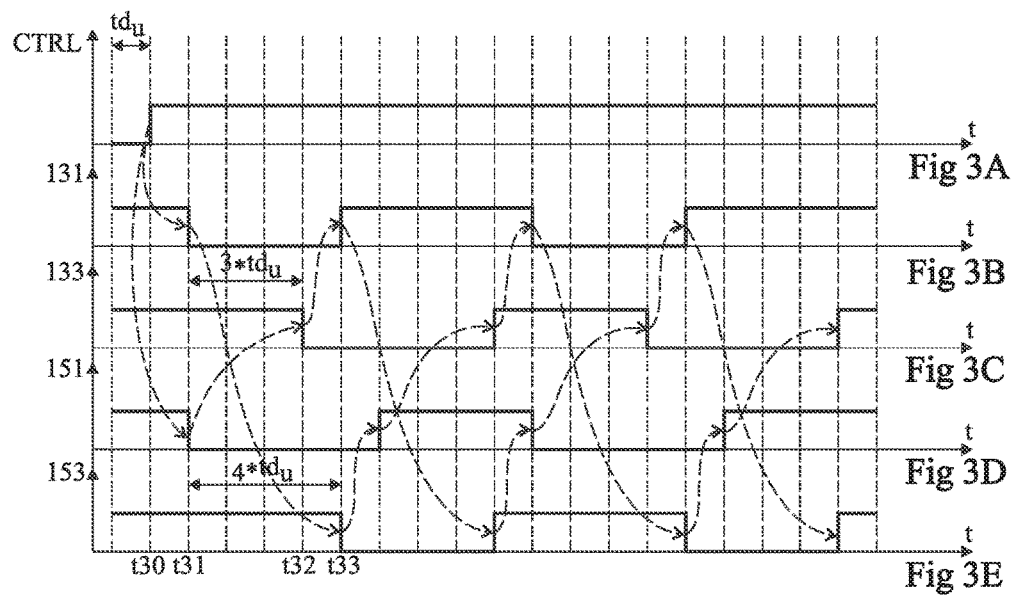
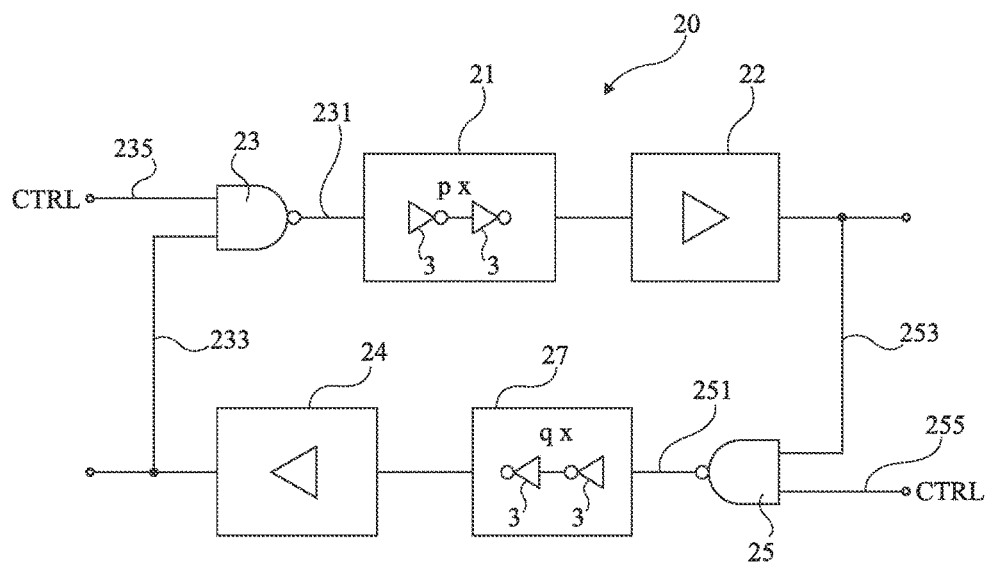
Fig 4

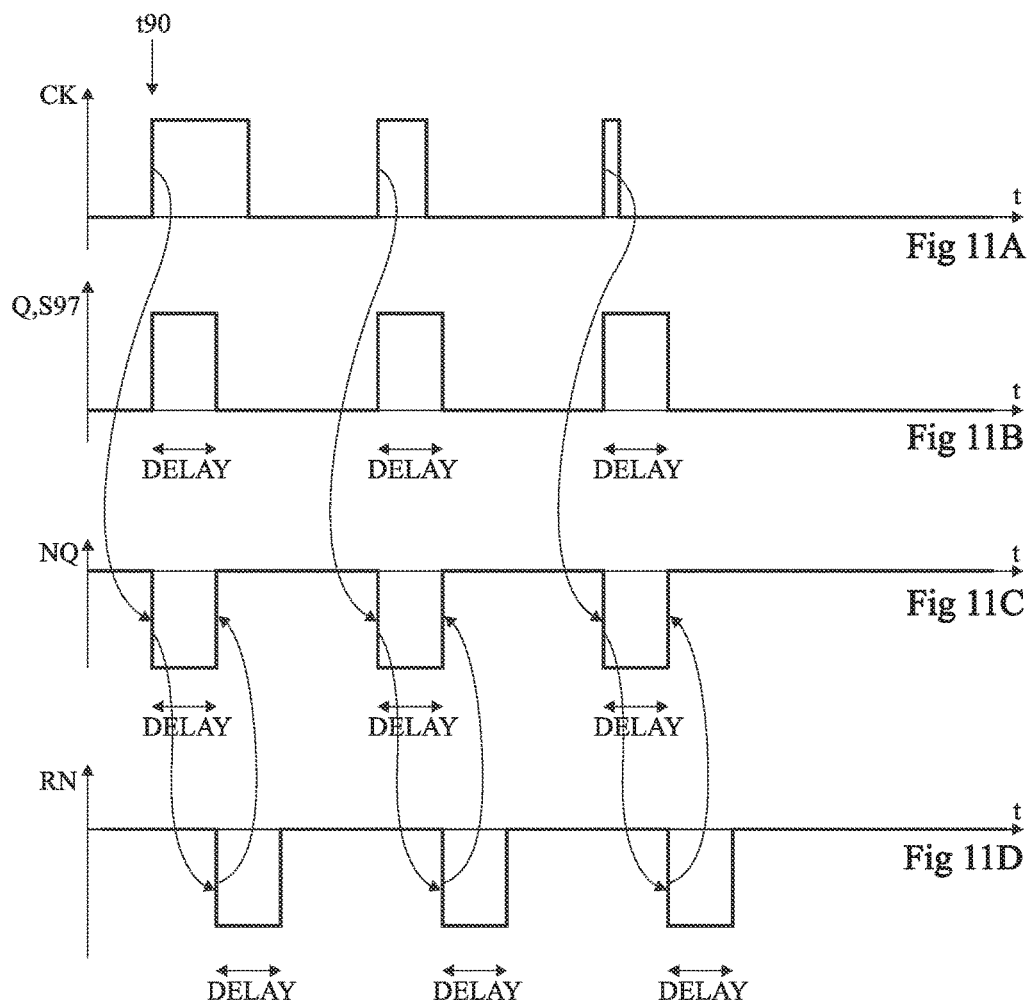

PULSE COUNTING CIRCUIT

PRIORITY CLAIM

This application claims the priority benefit of French Application for Patent No. 1654078, filed on May 4, 2016, the disclosure of which is hereby incorporated by reference in its entirety.

TECHNICAL FIELD

The present disclosure generally relates to electronic circuits and, more particularly, to circuits or electronic functions usable in a circuit or electronic device. An example of application of the electronic circuits and functions of the present description is the forming of a random number generator. Another example of application is the forming of a physical unclonable function (PUF), for example, to generate unique identifiers or unique encryption keys. The present disclosure more particularly relates to random number generators in security applications such as ciphering, authentication, etc.

BACKGROUND

In many applications, processing units, for example, central processing units (CPU) of microcontrollers, use randomly generated numbers.

Random number generation circuits use various circuits or subsets which may have other applications than random number generation. In particular, a random number generator uses circuits of oscillator, multiplexer, and the like type which, although they are particularly advantageous in random number generation, are not limited to such applications.

Number generators to which the present disclosure applies are based on the use of delay lines looped back on each other.

There is a need to improve random number generators or circuits supplying physical unclonable functions.

More generally, there is a need to improve logic electronic functions, usable not only in random or reproducible number generation applications, but also in other applications where similar problems are posed.

SUMMARY

An embodiment overcomes all or part of the disadvantages of usual solutions for generating random numbers or physical functions for unique identifiers, encryption keys, etc.

An embodiment according to an aspect of the present disclosure provides a circuit having a behavior which can be modeled to form a generation of numbers of oscillations for random number or unclonable number generation purposes.

An embodiment according to this aspect provides a generator having a behavior which can be verified.

An embodiment according to this aspect provides a solution compatible with the use of standard cells of a given electronic technology.

An embodiment according to another aspect of the present disclosure provides a symmetrical multiplexer structure (that is a structure having a similar behavior in time to conduct a rising edge and to conduct a falling edge).

An embodiment according to this other aspect provides a multiplexer structure compatible with usual multiplexer structures.

An embodiment according to still another aspect of the present disclosure provides a counter of noisy signal state switching (oscillations).

An embodiment according to this still another aspect provides a solution more particularly adapted to the counting of an oscillation generator.

Thus, an embodiment of a first aspect provides a circuit for generating a number of oscillations, comprising: a first branch comprising at least one delay line introducing symmetrical delays on rising edges and on falling edges and at least one asymmetrical delay element introducing different delays on rising edges and on falling edges; a second branch, looped back on the first one and comprising at least one delay line introducing symmetrical delays on rising edges and on falling edges.

According to an embodiment of this first aspect, the second branch further comprises at least one asymmetrical delay element introducing different delays on rising edges and on falling edges.

According to an embodiment of this first aspect, NAND-type gates combining the respective outputs of the branches with a control signal are interposed between the respective outputs of each branch and the input of the other branch.

According to an embodiment of this first aspect, the delay lines are formed of logic elements resulting in a single-input non-inverting function having identical rise and fall times.

According to an embodiment of this first aspect, the delay element(s) are formed of non-inverting logic circuits.

According to an embodiment of this first aspect, each delay element is formed of a logic function which can be reduced to a non-inverting function only depending on a single input and having different rise and fall times.

According to an embodiment of this first aspect, the one or more branches further comprise a second delay line introducing symmetrical delays on rising edges and on falling edges, connected in parallel on the delay element of the concerned branch.

An embodiment also provides a number generator comprising: at least one circuit for generating a number of oscillations; and at least one counter of the number of oscillations generated by said circuit.

According to an embodiment, said circuit is configured to generate a random number of oscillations.

An embodiment also provides an electronic device comprising at least one number generator configured to generate a reproducible number.

An embodiment of a second aspect provides a logic two-to-one multiplexer, comprising: two input terminals; one output terminal; a control terminal; and a multiple of four series-connected two-to-one multiplexers, a first multiplexer having its inputs connected to the input terminals, a last unit multiplexer having its output connected to the output terminal, and the other multiplexers having their respective inputs interconnected to the output of the previous multiplexer in the series association, half of the multiplexers being controlled in reverse with respect to another half.

According to an embodiment of this second aspect, the multiplexers are inverting multiplexers.

According to an embodiment of this second aspect, all multiplexers are identical.

According to an embodiment of this second aspect, half of the multiplexers have their control inputs connected to said control terminal.

According to an embodiment of this second aspect, the other half of the multiplexers have their control inputs connected to the output of a multiplexer having an input connected to said control terminal.

An embodiment also provides a four-to-one multiplexer, comprising three two-to-one logic multiplexers.

An embodiment also provides a number generation circuit, comprising at least one multiplexer such as hereinabove.

An embodiment of a third aspect provides a circuit for counting pulses supplied by a circuit having at least two inverted pulse signal supply terminals, comprising: a first counter of the pulses of a first pulse signal supplying a first count; a second counter of the pulses of a second pulse signal supplying a second count; and an element for selecting one of the counts.

According to an embodiment of this third aspect, the selection element receives, in addition to the counts supplied by the counters, said pulse signals.

According to an embodiment of this third aspect, the selection element takes into account the disappearing of pulses of one of the pulse signals.

According to an embodiment of this third aspect, the selected count is that of the counter having the pulse signal which stops first.

According to an embodiment of this third aspect, the selected count is that of the counter having the pulse signal which stops last.

According to an embodiment of this third aspect, the selected count is that: of the counter having the highest count if the two counts have the same parity; or of the counter having the highest count if this count is even and the lowest one if the count is odd.

According to an embodiment of this third aspect, the selection circuit supplies the least significant bit of the selected count.

According to an embodiment of this third aspect, the pulses are supplied by two delay lines looped back on each other of an oscillation generator.

According to an embodiment of this third aspect, the pulse counting circuit further comprises, upstream of each counter, a pulse shaping circuit.

According to an embodiment of this third aspect, the shaping circuit comprises a flip-flop having an output looped back on an initialization or reset (RN) input after crossing a delay element.

According to an embodiment of this third aspect, the delay introduced by the delay element is greater than the minimum time for the flip-flop to take a pulse into account.

An embodiment also provides a number generation circuit, comprising at least one pulse counting circuit.

The foregoing and other features and advantages will be discussed in detail in the following non-limiting description of specific embodiments in connection with the accompanying drawings.

BRIEF DESCRIPTION OF THE DRAWINGS

For a better understanding of the embodiments, reference will now be made by way of example only to the accompanying figures in which:

FIGS. 3A, 3B, 3C, 3D, and 3E illustrate, in the form of timing diagram, a new interpretation of the operation of a generator of a number of oscillations;

FIG. 4 shows an embodiment of an oscillation generator;

FIGS. 11A, 11B, 11C, and 11D illustrate, in the form of timing diagrams, the operation of the shaping circuit of FIG. 10.

DETAILED DESCRIPTION

Figure 1:
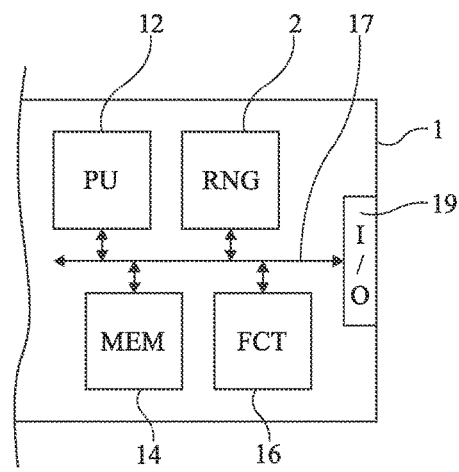
FIG. 1 schematically shows in the form of blocks an embodiment of electronic circuit of the type to which the described embodiments apply.

The same elements have been designated with the same reference numerals in the different drawings. In particular, the structural and/or functional elements common to the different embodiments may be designated with the same reference numerals and may have identical structural, dimensional, and material properties. For clarity, only those steps and elements which are useful to the understanding of the described embodiments have been shown and will be detailed. In particular, the uses of the generated numbers (random or unclonable) and the applications of circuits integrating the described generator have not been detailed, the described embodiments being compatible with current uses and applications. Arbitrarily, the high state of a logic signal is designated as 1 and its low state is designated as 0. When reference is made to terms "about", "approximately", or "in the order of", this means to within 10%, preferably to within 5%.

The number generator of the present disclosure is described hereafter in relation with an example of a generator of random numbers of oscillations. Unless otherwise specified, all that is described hereafter however applies to a generator of a number of oscillations for an unclonable physical function.

FIG. 1 very schematically shows an electronic circuit 1 of the type to which the embodiments which will be described apply.

Circuit 1 includes: a calculation or processing entity 12 (PU), for example, a state machine, a microprocessor, a programmable logic circuit, etc.; one or a plurality of volatile and/or non-volatile storage areas 14 (MEM) for storing all or part of the data and keys; one or a plurality of circuits 16 implementing various functions (FCT) related to the application for which circuit 1 is intended, for example, a cryptoprocessor, a biometric sensor control circuit, etc.; one or a plurality of data, address, and/or control buses 17 between the different elements internal to circuit 1 and an input-output interface 19 (I/O) for communicating with the outside of circuit 1; and one or a plurality of random number generation circuits 2 (RNG).

Figure 2:
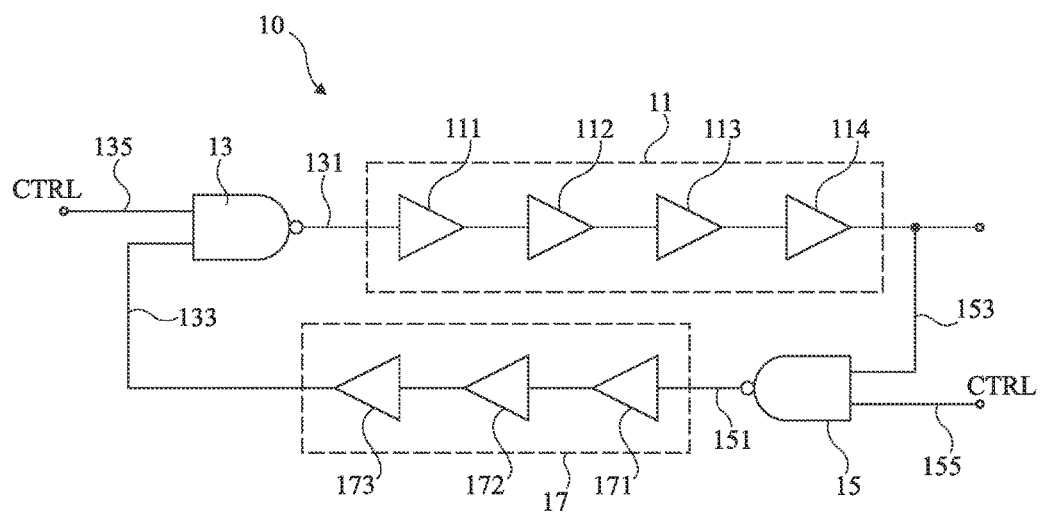
FIG. 2 shows an example of a circuit for generating a number of oscillations for a generator of random numbers or of an unclonable number.

FIG. 2 shows an example of electric diagram of a usual generator 10 of a number of oscillations for a random number generator.

Generator 10 is based on two delay lines, each formed of series-connected delay elements, looped back on each other, each delay element returning the signal in the same state (1 or 0) as its input. The number of delay elements of each chain may be different or identical. In the shown example, a first line 11 comprises four series-connected delay elements 111, 112, 113, and 114 between an output terminal 131 of a first NAND-type logic gate 13 and a first input terminal 153 of a second NAND-type logic gate 15. A second line 17 comprises three series-connected delay elements 171, 172, and 173 between an output terminal 151 of second gate 15 and a first input 133 of first gate 13. The second respective inputs 135 and 155 of logic gates 13 and 15 form input terminals intended to receive a same control signal CTRL (for starting the generation of a number). The number of oscillations, which conditions the random number, is sampled, for example, on the output of the first line, that is, on first input 153 of gate 15. As a variation, the number of oscillations is sampled on input 133 of gate 13, at output 131 of gate 13, or at output 151 of gate 15.

The difference between the delays introduced by the two lines conditions the duty cycle of the signals present at terminals 133 and 153.

Theoretically, the generator of FIG. 2 oscillates indefinitely with a duty cycle as long as signal CTRL is at state 1. In practice, in the absence of noise but with delay elements (logic gates) having different delays, which end up sufficiently deforming the duty cycle for the oscillator to stop, the generator ends up stopping after a fixed number of oscillations. In the presence of noise (jitter), the generator ends up stopping, but after a number of oscillations having a variable value. Thus, the fact for the generator to stop is not a problem per se, on the contrary, but the problem is not to be able to determine around which value (what number of oscillations) it will stop. Indeed, in order for the random number generator to operate properly, it must have accumulated enough noise, and thus a sufficient number of oscillations so that the result of the counting of the number of oscillations provides, when the counter stops, enough randomness at the level of its least significant bit or of a few (less than ten) least significant bits of the oscillation counter.

The above-described embodiments derive from a new analysis of the behavior of a generator of numbers of oscillations.

In particular, the inventors have observed that it is possible to relate the behavior of the generator of numbers of oscillations to the intrinsic quantifiable parameters of the elements forming it.

FIGS. 3A, 3B, 3C, 3D, and 3E illustrate in timing diagrams the theoretical operation of the circuit of FIG. 2. FIG. 3A shows an example of shape of signal CTRL. FIG. 3B illustrates a corresponding example of shape of the signal present on output 131 of gate 13.

FIG. 3C illustrates a corresponding example of shape of the signal present on the output of the first line (input 133 of gate 13). FIG. 3D illustrates a corresponding example of shape of the signal present on output 151 of gate 15. FIG. 3E illustrates a corresponding example of shape of the signal present on the output of the first line (input 153 of gate 15).

The delay introduced by each gate and by each delay element is assumed to have a value tdu, identical for all elements and gates.

When signal CTRL is at state 0, outputs 131 and 151 are always at state 1. Accordingly, outputs 133 and 153 of lines 17 and 11 are stable at state 1.

At a time t30, signal CTRL is switched to state 1 to activate the generation. After a delay tdu, outputs 131 and 151 switch to state 0 at a time t31. Lines 13 and 15 respectively introduce delays by $4*td_u$ and $3*td_u$ on the rising and falling edges of the signals present at terminals 131 and 151. Accordingly, signal 133 switches to state 1 at a time t32 subsequent by $3*td_u$ to time t31 and signal 153 switches to state 1 at a time t33 subsequent by $4*td_u$ to time t31.

Signals 131 and 151 then switch to state 1 with a delay $td_u$ with respect to times t32 and t33 respectively, and so on.

The number of sampled oscillations, preferably at output 153 (or 133), when the oscillation stops, is random.

It should be noted that this number of oscillations may be counted at any point of the loop.

The inventors consider that, in addition to the phase noise, one of the factors which results in stopping the generator particularly originates from an imbalance between rise times and fall times of the signals, that is, between the time taken by a delay element or a gate to switch from state 1 to state 0 and from state 0 to state 1. Indeed, the delay between the rise time and the fall time of a branch of the generator (delay line plus NAND gate) results in that there comes a time when the duration of a state becomes shorter than the delay introduced by an element of the delay line.

A problem is that this "time" is a function of the number of delay elements in the line (accumulation of time shifts). It would however be desirable for the duration at the end of which a generator stops to be controllable, so as to, on design of a new circuit, be able to guarantee that the number of oscillations before the stopping of the generator is sufficient.

Taking the same notations as in the example of FIG. 2, the following notations will be used:

$t1_n$, the time of an edge (rising or falling) of rank n of the signal of output 131;

$t2_n$, the time of an edge (rising or falling) of rank n of the signal of output 151;

$L1_n$, the duration of the low level of rank n of the signal of output 131 (this duration is linked to the delay introduced by second line 17 plus first gate 13);

$H2_n$, the duration of the high level of rank n of the signal of output 151 (this duration is linked to the delay introduced by first line 11 plus second gate 15);

$tr_1$ and $tf_1$, the respective rise and fall times of the signal of output 151 with respect to the switching time of terminal 131; and $tr_2$ and $tf_2$, the respective rise and fall times of the signal of output 131 with respect to the switching time of terminal 151.

The generator behavior may be written from arithmetic sequences.

In particular, the following can be written:

$$L1_n = t1_{2n+1} - t1_{2n}; \text{ and}$$

$$H2_n = t2_{2n+2} - t2_{2n+1}.$$

Further:

$$t1_{2n} = t2_{2n-1} + tf_2;$$

$$t1_{2n+1} = t2_{2n} + tr_2;$$

$$t2_{2n-1} = t1_{2n-2} + tr_1; \text{ and}$$

$$t2_{2n} = t1_{2n-1} + tf_1.$$

The following can be deduced:

$$L1_n = H2_{n-1} - \Delta fr_2, \text{ with } \Delta fr_2 = tf_2 - tr_2; \text{ and}$$

$$H2_{n-1} = L1_{n-1} + \Delta fr_1, \text{ with } \Delta fr_1 = tf_1 - tr_1.$$

Based on these relations, the recurrences of the difference durations can be simply expressed according to the differences between the rise and fall times.

For example, for duration, $L1_n$, one can write:

$$L1_{n+1} = L1_n + \Delta fr_1 - \Delta fr_2.$$

Then, by expressing the sequence from the first term $L1_0$ (n=0):

$$L1_n = L1_0 - n^*r, \text{ with } r = \Delta fr_2 - \Delta fr_1.$$

An arithmetic sequence having a common ratio r that can be determined, on design of the circuit, according to the number of selected basic cells (delay elements) and to their interval between rise time and fall time, is thus obtained.

A similar relation can be written for durations H2, with:

$$H2_n = H2_0 - n^*r.$$

Similarly, by noting:

$H1_n$, the duration of the high level of rank n of the signal of output 131 (this duration is linked to the delay introduced by first line 11 plus second gate 15);

$L2_n$, the duration of the low level of rank n of the signal of output 151 (this duration is linked to the delay introduced by first line 11 plus second gate 15);

the following relations can be obtained:

$$H1_n = H1_0 + n^*r; \text{ and}$$

$$L2_n = L2_0 + n^*r.$$

If the difference between the rise times and the fall times (common ratio r) is negative, durations L1 and H2 increase while durations L2 and H1 decrease. Conversely, if common ratio r is positive, durations L1 and H2 decrease while durations L2 and H1 increase.

FIG. 4 shows an embodiment of a generator of numbers of oscillations taking advantage of this analysis.

In practice, it is desired to be able to control (in order to respect the characteristics desired for the random generator) the behavior along time of the oscillation generator, that is, the duration from which it stops. This duration is not only a function of the delay introduced by the delay lines, but also of the rise and fall times of the lines.

Knowing the behaviors of the basic cells (delay elements) of the technology in which the random generator is desired to be formed, the number of oscillations after which the generator will stop can be deduced. With a positive common ratio r, a limit can be set when duration $L1_n$ becomes zero, that is, for $n = L1_0/r$. In practice, the oscillations stop when the duration of the pulse becomes shorter than the delay of a delay element.

According to this embodiment, each branch is formed of a delay line 21, respectively 27, called symmetrical, that is, having identical or very close rise and fall times (interval between the rise and fall time shorter than one tenth of common ratio r) in series with an element 22, respectively 28, called asymmetrical, having rise and fall times different from each other. An input terminal 231 of the first branch is connected to the output of a first NAND-type logic gate 23 having a first input 235 receiving a trigger signal CTRL and having a second input 233 receiving the output of the second branch. An output terminal 253 of the first branch is connected to a first input of a second NAND-type gate 25 having a first input 255 receiving signal CTRL and having its output 251 connected to the input of the second branch. The output of the generator of a random number of oscillations is for example terminal 253 or terminal 233. As previously, this output, and thus the oscillation counting, may correspond as a variation to output 231 or 251 of gate 23, respectively 25, or more generally at any point of the loop. In practice, the output is connected to the output of an asynchronous counter of the number of oscillations, which counts the number of oscillations between the activation of the generator by signal CTRL and the stopping of the oscillations. This counter (not shown in FIG. 4) is, for example, formed of a flip-flop or of a plurality of flip-flops in cascade, the clock input of the or of a first flip-flop receiving the output signal of the generator. The flip-flop output(s) supply a number over one or a plurality of bits (according to the number of flip-flops), where generally only the least significant bit(s) are kept to form the random number.

A plurality of generators may be used in parallel to increase the rate of generated random bits.

To form symmetrical delay lines 21 and 27, paired up inverters, that is, an even number of inverters in each line, are preferably used. For example, line 21 comprises p pairs of inverters 3 in series while line 27 comprises q pairs of inverters 3 in series. Numbers p and q may be identical or different from each other.

By using pairs of inverters, not only is there no inversion of the signal at the output of each line, but above all, each line has an identical or very close rise and fall time (interval smaller than one tenth of the common ratio divided by p or by q). Indeed, by using identical logic cells of the concerned technology, even if an inverter 3 made in this technology has a rise time different from its fall time, a pair of identical inverters 3 forms an element having identical rise and fall times. Noting tr and tf the rise and fall times of an inverter 3, the rise and fall times of a pair becomes tr+tf (tr+tf or tf+tr) according to the direction of the input edge). Thus, even if times tf and tr are different from each other, their sum remains constant for all the inverter pairs. Lines 21 and 27 thus introduce a determinable constant delay whatever the transition (rising or falling).

Any type of inverter may be used (for example, CMOS inverters formed of two series-connected transistors, NOR or NAND gates with interconnected inputs, etc.), provided for these inverters to respect the condition of associating, when they are paired in series, successively the rise time and the fall time, or conversely, so that these times are summed up whatever the edge present at the input.

To form asymmetrical elements 22 and 24, a non-inverting element of logic amplifier type (buffer) is used, excluding two identical series-connected inverters. For example, an OR-type, AND-type gate having its two inputs connected or also any logic function which may be reduced to an inverting function only depending on a single input and having different rise and fall times may be used. Each element 22 and 24 is selected to have a rise time different from its fall time. Further, elements 22 and 24 are selected to have different intervals between their rise time and fall time. Thus, the intervals which will condition the stopping of the generator are introduced. In practice, as appears from the above-established formulas, gates 23 and 25 also introduce a shift between the rise and fall times of each branch. This shift should be added to that introduced by element 24, respectively 22, to obtain intervals, respectively $\Delta fr_1$ and $\Delta fr_2$, and thus the common ratios of the arithmetic sequences.

An advantage of the provided embodiment is that numbers p and q of pairs of inverters of lines 21 and 27 have no influence on the common ratio of the arithmetic sequences defining the oscillations. Indeed, they only condition the first terms of each sequence, that is, the durations of the first pulses which follow the switching of signal CTRL to activate the generation.

According to a simplified embodiment, a single element 22 or 24 is provided, the other branch only having the symmetrical delay line.

Lines 21 and 27 may be indifferently placed upstream or downstream of elements 22 and 24 with which they are respectively associated. As a variation, elements 22 and 24 are even interposed inside of lines 21 and 27, between inverters or pairs of inverters forming them.

An advantage of the described embodiments is that it is now easy to size an oscillation generator and to be able to characterize it. Thus, on design of an electronic circuit comprising a random number generator, knowing the intervals between the rise and fall times in the technology, it becomes easy to fulfill specifications.

The interpretation of the generated number is performed by counting the pulses on one of outputs 233 and 253 and by taking, as a random bit, for example, the least significant bit at the end of the counting period. The counting period is set by a clock signal.

Figure 5:
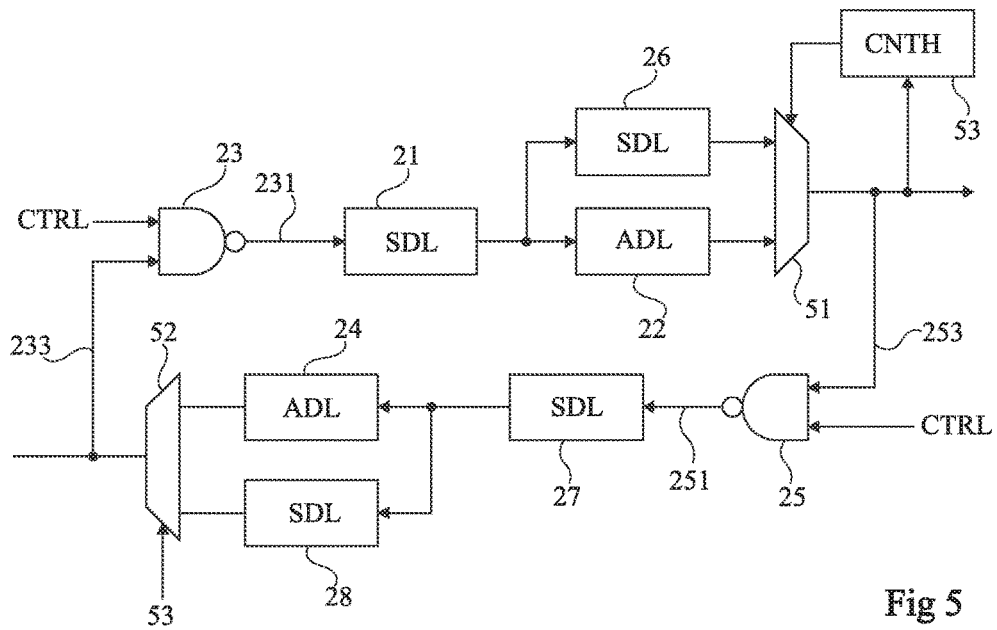
FIG. 5 schematically shows in the form of blocks an alternative embodiment of a generator of a number of oscillations.

FIG. 5 schematically shows an alternative embodiment according to which the common ratio of the arithmetic sequence is desired to be minimized, while remaining easy to determine.

According to this variation, as compared with the embodiment of FIG. 4, one provides, in parallel with each element 22, 24 or asymmetrical delay line (ADL), a second symmetrical delay line (SDL) 26, respectively 28. The inputs of delay lines 22 and 26 are connected to the output of line 21. The inputs of lines 24 and 28 are connected to the output of line 27. The outputs of lines 22 and 26, respectively 24 and 28, are connected to inputs of a two-to-one multiplexer 51, respectively 52, having its output connected to input 253, respectively 233, of logic gate 25, respectively 23. Multiplexer 51 is controlled by a signal resulting from a counting (counter 53, CNTH) of the pulses of its output signal. In other words, the counter determines the number of pulses from which it is switched from asymmetrical line 22 to symmetrical line 26. On the side of multiplexer 52, a control by the same counter 53 or by a different counter which then counts the pulses of the output of multiplexer 52 may be provided. In practice, if a single counter is used, it is placed on the branch having the longest delay to avoid switching the multiplexers before the end of the first pulses.

Such a variation enables to make the common ratio of the arithmetic sequences configurable and more particularly to decrease this common ratio to delay the stopping of the generator.

Indeed, executing an asymmetrical loop (a pulse on each branch) and the rest of the loops only with the symmetrical elements (21, 26, 27 and 28) minimizes the common ratio of the sequence. Taking the above notations, common ratio r is divided by the number of loops. This enables, among others, to increase the number of pulses flowing through the delay lines of the generator while decreasing the size of the delay lines.

Counter 53 may be the counter counting the pulses having their least significant bit(s) used, when the oscillations stop, to define the generated random number.

Figure 6:
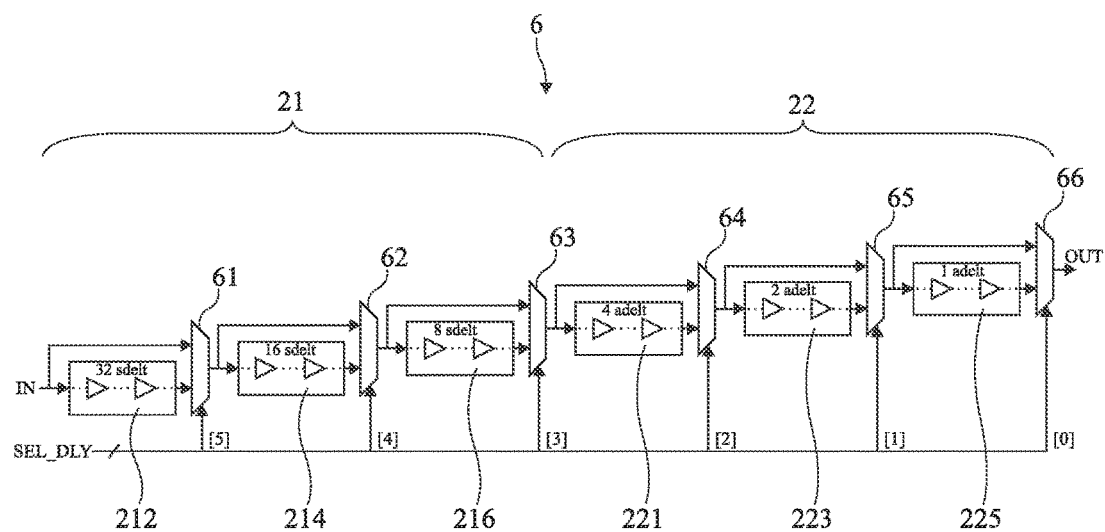
FIG. 6 schematically shows an embodiment of delay lines for a generator of a number of oscillations.

FIG. 6 shows an embodiment of a delay line 6, parameterizable both to have a symmetrical delay and an asymmetrical delay.

The embodiment of FIG. 6 may form, as a specific example in the previous embodiments, an embodiment of the symmetrical delay line, for example, 21, and of the asymmetrical delay element, for example, 22, of a branch.

According to this embodiment, one or a plurality (in the example, three) symmetrical delay lines 212, 214, and 216, that is, each having identical rise and fall times, are associated with one or a plurality (in the example, three) delay elements or asymmetrical delay lines 221, 223, 225, that is, each having different rise and fall times, each asymmetrical or symmetrical line being bypassable by means of a multiplexer 61, 62, 63, 64, 65, 66, respectively. In other words, the inputs of lines 212, 214, 216, 221, 223, and 225 are respectively connected to a first input of multiplexers 61, 62, 63, 64, 65, 66 having its other input connected to the output of the corresponding delay line. The outputs of multiplexers 61, 62, 63, 64 and 65 are respectively connected to the inputs of lines 214, 216, 221, 223, 225 and the output of multiplexer 66 defines output OUT of the parameterizable delay line.

Each multiplexer 61 to 66 is individually controllable, for example, by a different bit, respectively bit 5, bit 4, bit 3, bit 2, bit 1, and bit 0, of a word SEL_DLY.

In an application to the forming of a generator of numbers of oscillations of the type illustrated in FIG. 4, input terminal IN of line 6 is connected to the output (231 or 251, FIGS. 4 and 5) of the concerned branch.

Each line 212, 214, 216 is preferably formed of one or a plurality of inverter pairs, that is, of delay elements, each having identical rise and fall times as described hereabove. In the shown example, lines 212, 214 and 216 respectively comprise 32, 16 and 8 pairs of inverters, that is, 32, 16 and 8 unit symmetrical delay elements (sdelt).

Asymmetrical lines 221, 223, 225 introduce identical or different delays. Preferably, lines 221, 223, and 225 are formed of identical unit elements, that is, introducing the same shift between rise time and fall time. Different numbers of the unit elements are then provided in each of the lines, which makes the system easily parameterizable with an optimal granularity. In the shown example, lines 221, 223, and 225 respectively comprise 4, 2, and 1 asymmetrical unit delay elements (adelt).

Thus, the delay and the difference between rise time and fall time of delay line 6 can both be parameterized. Taking the example of identical unit elements in lines 212, 214, and 216 and of identical unit elements in lines 221, 223, and 225, a symmetrical delay in the range from 8 to 56 times the delay of the symmetrical unit element and a time interval between the rising edge and the falling edge in the range from 1 to 7 times the interval introduced by the symmetrical unit element may be selected.

The unit elements are for example formed as described hereinabove in relation with FIG. 4.

The number of symmetrical and asymmetrical delay lines depends on the desired adjustment capacity. The asymmetrical elements have not only different rise and fall times, but also an intrinsic delay which contributes to the total delay of the delay line.

The embodiment of FIG. 6 may for example be used to integrate a same generator architecture and to make this structure parameterizable, be it on design or in the application.

The embodiment of FIG. 6 may be combined with that of FIG. 5 by placing, in parallel with each asymmetrical line 221, 223, 225, a symmetrical line of same delay, thus suppressing the bypass of the line driving the upper inputs (in the orientation of FIG. 6) of multiplexers 64 to 66. As a variation, 3-to-1 multiplexers having two inputs receiving the respective outputs of two lines in parallel of same delay, respectively symmetrical and asymmetrical, and having the third input directly receiving the output of the multiplexer of previous rank, are used.

In the embodiment of FIG. 6 or of its variations, to make the parameterizing easier, it would be desirable for multiplexers 61 to 66 to introduce symmetrical delays. Now, a usual multiplexer has an asymmetrical operation in terms of rise time and of fall time.

Figure 7:
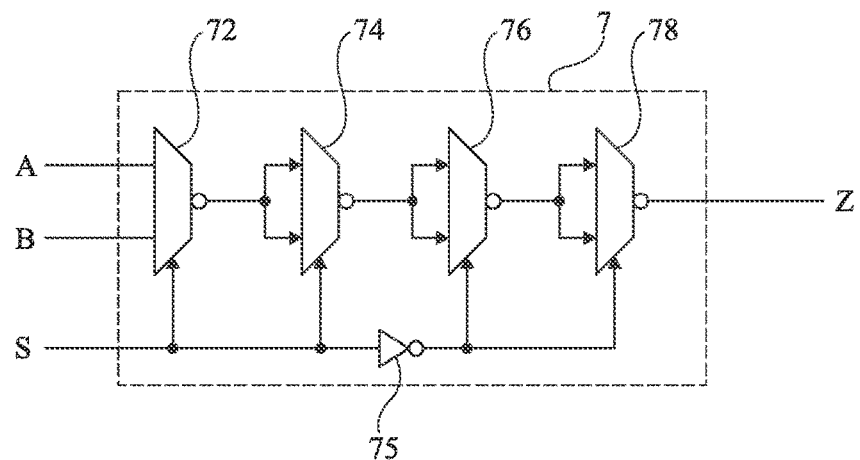
FIG. 7 schematically shows an embodiment of two-to-one symmetrical multiplexer circuit.

FIG. 7 shows an embodiment of a multiplexer 7 having a symmetrical operation, that is, identical rise and fall times.

Multiplexer 7 or FIG. 7 is a two-to-one multiplexer, that is, it selects one of its two inputs A or B and supplies the corresponding signal at output Z. The selection between A or B is performed by a control signal S.

Multiplexer 7 comprises four two-to-one multiplexing or selection elements. Multiplexer 7 can be considered as being formed of 4 unit multiplexers 72, 74, 76, and 78 associated in a chain. The multiplexers are inverting multiplexers. A first multiplexer 72 has its input terminals respectively connected to inputs A and B. A second multiplexer 74 has its two inputs connected together to the output of first multiplexer 72. A third multiplexer 76 has its two inputs connected together to the output of second multiplexer 74. A fourth multiplexer 78 has its two inputs connected together to the output of third multiplexer 76 and its output delivers output Z. Signal S directly controls multiplexers 72 and 74 and, after having crossed an inverter 75, multiplexers 76 and 78.

The fact for multiplexers 74, 76, and 78 to have their inputs interconnected results in that they actually perform no selection. However, assuming that all multiplexers 72, 74, 76, and 78 are identical, they all have identical rise and fall times. Further, they all have a similar behavior in the presence of an edge on their first input and all have a similar behavior in the presence of an edge on their second input.

Noting tr the rise times, tf the fall times, and by adding to these notations a first index A, respectively B, according to whether the edge is on input A (the first input of the concerned multiplexer) or B (the second input of the concerned multiplexer) and a second index 72, 74, 76, or 78 according to the concerned multiplexer, one may write:

$$tr_{A72}=tr_{A74}=tr_{A76}=tr_{A78}=tr_A;$$

$$tf_{A72}=tf_{A74}=tf_{A76}=tf_{A78}=tf_A;$$

$$tr_{B72}=tr_{B74}=tr_{B76}=tr_{B78}=tr_B; \text{ and}$$

$$tf_{B72}=tf_{B74}=tf_{B76}=tf_{B78}=tf_B.$$

Due to the inversion of the control of the two multiplexers 76 and 78 with respect to that of multiplexers 72 and 74, the rise and fall times of multiplexer 7, from input A or B to output Z, may be written according to whether a rising edge r or falling edge f is present on input A or on input B:

$$tr_{AZ}=tf_{A72}+tr_{A74}+tf_{B76}+tr_{B78};$$

$$tf_{AZ}=tf_{A72}+tf_{A74}+tr_{B76}+tf_{B78};$$

$$tr_{BZ}=tf_{B72}+tr_{B74}+tf_{A76}+tr_{A78}; \text{ and}$$

$$tf_{BZ}+tf_{B72}+tf_{B74}+tr_{A76}+tf_{A78}.$$

Since the unit rise and fall times are identical for a given input, one can deduce:

$$tr_{AZ}=tf_{AZ}=tr_{BZ}=tf_{BZ}=tr_A+tf_A+tr_B tf_B.$$

Accordingly, the rise and fall times of multiplexer 7 are identical whatever the considered input. The multiplexer is thus symmetrical with the above given definition.

As a variation, it may be provided to invert the control in other locations, provided for the two multiplexers to select their first respective inputs when the two others select their second respective inputs. In this case, it will however be ascertained that the propagation delay introduced by the inverters is not greater than the minimum propagation time of a unit multiplexer, short of which the output is altered. An advantage of the embodiment of FIG. 7 is that it guarantees that the selection of multiplexers 76 and 78 is active before the signal (the edge) has ended crossing multiplexers 72 and 74.

Although this provides no advantage in terms of symmetry, it may be provided to use 8, 12, 16, and more generally any multiple of four unit multiplexers, provided for half of them to be controlled in reverse with respect to the other half. This, for example, enables to increase the propagation time without altering the symmetry of the operation.

An advantage of the embodiment of FIG. 7 is that it is independent from the internal structure of the unit multiplexers. Indeed, provided to use identical unit multiplexers, the described operation is respected.

A multiplexer such as shown in FIG. 7 has multiple applications. In particular, it is frequently advantageous to have a symmetrical operation.

As a specific example of application, the multiplexer of FIG. 7 may be used to form each of multiplexers 61, 62, 63, 64, 65 and 66 of the embodiment of FIG. 6. An advantage then is that the common ratio of the pulse sequences of the number generator remains only linked to asymmetrical elements 221, 223 and 225, which eases the sizing.

The structure of multiplexer 7 of FIG. 7 may be adapted to form multiplexers with more than two inputs.

Figure 8:
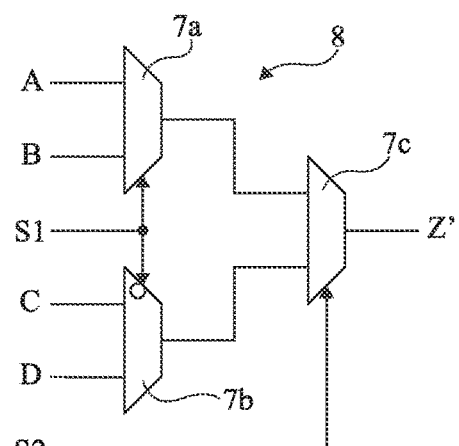
FIG. 8 shows an embodiment of a four-to-one symmetrical multiplexer.

FIG. 8 shows an embodiment of a symmetrical four-to-one multiplexer 8.

According to this embodiment, three two-to-one multiplexers of the type of that in FIG. 7 are used. A first multiplexer 7a defines two inputs A and B. A second multiplexer 7b defines inputs C and D. The respective outputs of multiplexers 7a and 7b are connected to the two inputs of a third multiplexer 7c having its output defining output Z' of the four-to-one multiplexer. Multiplexers 7a and 7b are respectively controlled by a signal S1 and by its inverse. Multiplexer 7c is controlled by a signal S2. For example, assuming a selection word over two bits, signal S2 is formed by the most significant bit and signal S1 is formed by the least significant bit.

In a random number generator of the above-described type, the interpretation of the generator output requires counting the pulses present at the output. This counting determines the drawn number. For example, the least significant bit of the count of the pulses present at the generator output between the starting thereof and a read signal of the counter, subsequent to the stopping of the oscillations, is taken as the random bit generated by generator 20. The time interval between the starting of the generator and the read signal is selected according to the range of possible time intervals conditioned by the sizing of the delay lines of the generator.

However, in a counter, there may be an imbalance between the counts of state 1 and of states 0, in particular if one of the states of the signal to be counted becomes too short with respect to the other. This phenomenon is due to the fact that from a given pulse duration (in the direction of decreasing durations), the counter is only capable of taking into account the pulse in one direction according to the parity of the current count that it contains. There then is an imbalance between the probability of drawing a 1 and of drawing a 0. In other words, with a generator of the type in FIG. 4 (but also with that in FIG. 2), when the duty cycle becomes too deformed, the use of the generator output as a counting clock results in that the duration of the pulse (low or high according to the concerned output) is shorter than the minimum time required the flip-flop to take it into account. Now, this time differs for a high state and for a low state. Accordingly, whatever the output used, the flip-flop will leave its normal operation and one cannot determine in advance, on design, which output will be concerned.

This problem may be encountered not only to count the number of oscillations in a generator such as described in the present disclosure, but more generally to count events of short duration in a signal, for example, a glitch detector.

Indeed, a counter, be it asynchronous or not, operates normally with a clock, called square, that is, having a duty cycle close to 50%. Now, in the case of the above-described generator, the duty cycle of the clock of the asynchronous counter, which corresponds to output 231 or 251 (or 233, 253), decreases at each period until the end of the oscillation, or on the contrary increases at each period until the end of the oscillation. Accordingly, one of the outputs stops at step 0 and the other stops at state 1. However, one can generally not know with certainty which of the outputs will stop at state 1 and which one will stop at state 0. On the counter side, flip-flops which require in their specifications a minimum duration of the clock in the high state (1) and a minimum duration of the clock signal in the low state (0), for example, arbitrarily 110 ps for the minimum duration in the high state and 87 ps for the minimum duration in the low state, are used. Accordingly, when the input flip-flop of the counter receives a clock having a very low or very high duty cycle, it may end up operating outside of the specifications and the pulse of the clock signal is then not taken into account.

Figure 9:
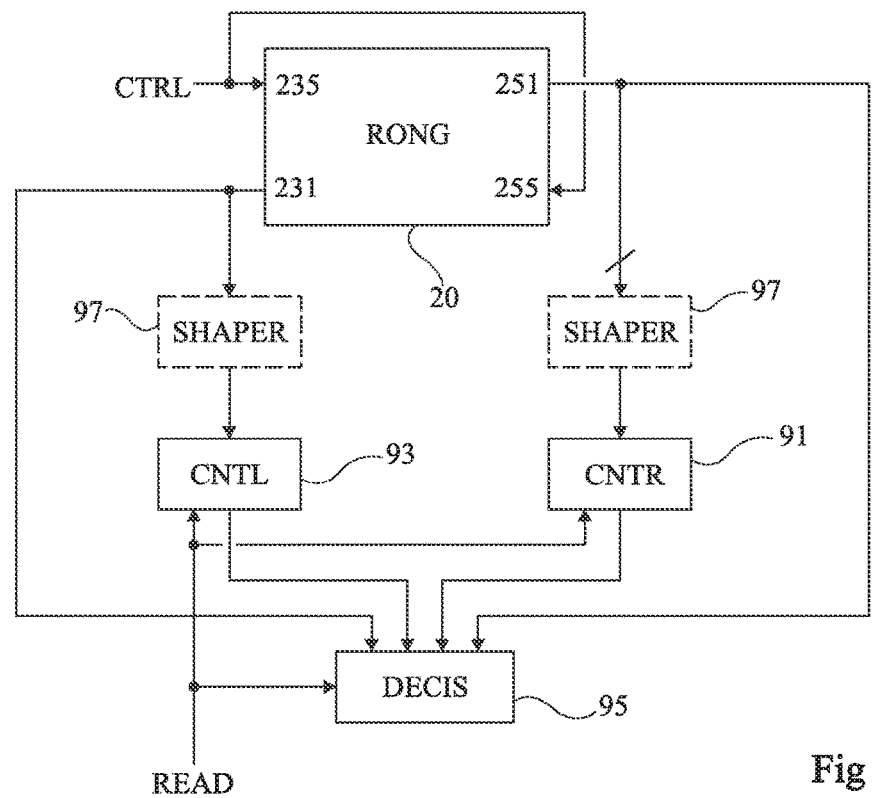
FIG. 9 shows an embodiment of a random number generator based on a generator of a number of oscillations.

FIG. 9 shows an embodiment of a random number generator of the above-described type with its pulse counting elements enabling to shape the generated number.

FIG. 9 illustrates a variation where the numbers of generated pulses are sampled from the output of gates 231 and 251.

According to this embodiment, each output 251, 231 of the random oscillation number generator 20 (RONG), for example, such as described in FIG. 4, is connected to the input of a counter, respectively 91 (CNTR), 93 (CNTL). Each counter 91, 93 counts the pulses of the corresponding generator output signal. Each counter is an asynchronous counter, for example, of D flip-flop type.

The reading of counters 91 and 93 is triggered by a signal READ which transfers the counts to a decision (DECIS) or combination circuit 95. Circuit 95 also receives output signals 231 and 251 to know, at the time of the decision, the states of these signals when the oscillations stop.

Functionally, counters of the number of oscillations are used, one with an output of generator 20, the other with the other output of generator 20. As indicated hereinabove, one of the counters will stop operating before the other, that is, its input flip-flop will stop operating before the input flip-flop of the other one, due to the fact that the minimum operating durations of the flip-flops are different for the low state and for the high state. In fact, one of the counters will stop under the effect of an oscillation which does not respect its minimum time in the low state while the other counter will stop under the effect of an oscillation which does not respect its minimum time in the high state.

According to applications, the criterion of selection by circuit 95 between the outputs of counters 91 and 93 according to the states supplied by outputs 231 and 251, differs. Such a selection criterion may be conditioned by a simulation of the generator operation to determine whether the flip-flops stop because of the minimum time in the high state or because of the minimum time in the low state.

For example, if importance is given to the parity of the counting result and assuming that the flip-flop of the counter which stops first stops under the effect of too short a duration in the low state (state 0), the value of the corresponding counter will be lower than the value of the other counter. If this effect is cumulated with an asymmetrical operation of the flip-flop, that is, an easier switching from 0 to 1 than from 1 to 0 (or conversely), this introduces a bias in the random number generation, which is not desirable. That of the counters which has stopped on a switching from 1 to 0 is then selected.

According to still another example where the parity has less importance than a high number of oscillations, the counter which stops last is selected.

According to still another example, the decision depends on the relation between counters. Thus, one keeps the value: of the counter having the highest count if the two counts have the same parity; or of the counter having the highest count if this count is even and the lowest one if the count is odd.

According to still another example, it is considered that that of the counters which keeps on operating has a high risk of operating asymmetrically since the other counter has already stopped. In this case, block 95 selects the result of the counter which stops first, that is, the first one which, on state switching of output 231 or 251, does not change its least significant bit. This embodiment is preferred in the case where the cause of the stopping of the flip-flops (minimum time in the low state or minimum time in the high state) has not been determined by simulation.

The fact of counting the two outputs and of taking one or the other according to cases enables to miss no pulse.

It should be noted that the counting circuit described in relation with FIG. 9 more generally applies to any random number generator and not necessarily to that of FIG. 4. In particular, it may be implemented for any random number generator having delay lines looped back on each other (for example, FIG. 2).

According to another embodiment of this counting aspect, the signals supplied by outputs 253 and 233 are shaped before being counted to eliminate possible miscounts. To achieve this, optional shaping circuits (SHAPER) 97 are interposed between respective outputs 251 and 231 and counters 91 and 93.

Figure 10:
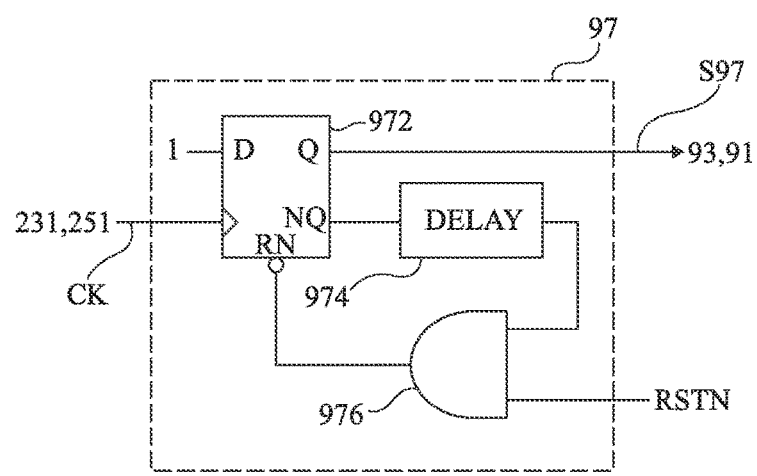
FIG. 10 shows an embodiment of a pulse signal shaping circuit.

FIG. 10 shows an embodiment of a pulse signal shaping circuit 97. Circuit 97 comprises a D-type flip-flop 972 having its D input forced to the high state (1) and having its Q non-inverted output defining output S97 supplying the shaped signal. The CK clock input of flip-flop 972 defines the input of the circuit receiving the pulse signal to be shaped. The NQ inverted output of flip-flop 972 is connected, via a non-inverting delay element 974 (DELAY), to a first input of an AND-type logic gate 976 having an output connected to the RN reset input (active on the rising edge) of flip-flop 972. A second input of gate 976 is intended to receive a signal RSTN for activating circuit 97. When signal RSTN is at state 0, circuit 97 is not active and output S97 is permanently at state 0. Gate 976 is thus optional if circuit 97 does not need to be deactivated.

The value of the delay introduced by element 974 is selected to be greater than the minimum pulse width that can be captured by the D flip-flop.

FIGS. 11A, 11B, 11C and 11D illustrate, in the form of timing diagrams, the operation of the shaping circuit of FIG. 10. FIG. 11A shows an example of shape of input signal CK to be shaped. FIG. 11B shows an example of corresponding shape of the signal of the Q output (S97). FIG. 11C shows an example of corresponding shape of the NQ output. FIG. 11D shows an example of corresponding shape of the signal of the RN input.

A pulse signal CK of positive pulses is assumed.

Initially, the Q output (and thus output S97) is at state 0, the NQ output is at state 1. The RN input is at state 1. Signal RSTN is assumed to be active (state 1).

On occurrence (time t90) of a rising edge on clock signal CK, since the D input is at state 1 and the RN input is at state 1, this pulse is transmitted onto the Q output which switches to state 1. However, the NQ output (inverse of the Q output) switches to state 0. This state is transmitted, with a delay DELAY on the RN input (considering the delay introduced by gate 976 included in value DELAY). The switching of the RN input at the end of delay DELAY causes the forcing of the Q output to state 0 and, accordingly, of the NQ output to state 1, which causes, in turn, always at the end of delay DELAY, a switching of the RN input to state 0. The flip-flop is then ready to take a new state into account. The right-hand portion of the timing diagrams illustrates the operation with a pulse CK having a duration shorter than delay DELAY. Delay DELAY sets the duration of the pulses of the output signal independently from the duration of the pulse of signal CK. Accordingly, even if the pulse of signal CK is theoretically too short for its fall to be taken into account, it is still present on the Q output.

Duration DELAY sets the duration of the pulses of signal S97, and thus of input of the counters in the embodiment of FIG. 10.

To form a shaping circuit operating with a pulse signal of negative pulses, the output of gate 976 is connected to the set input of the flip-flop, the input is forced to state 0, and the delay element receives the Q non-inverted output while the output of the shaping circuit is defined by the NQ inverted output. The operation can be easily transposed from the above explanations.

An advantage of the embodiments which have been described is that they enable to reliably design or to configure a random number generator in determinable fashion. Thus, the criteria set by specifications can be fulfilled and the fact for the generator to fulfill these specifications can be validated.

Another advantage is that the described solution is compatible with the use of standard cells of a given technology.

Another advantage is that the generator assembly can be formed with logic elements.

For a random number generator, the number is sampled either after a fixed time interval, started by the activation of the generator (signal CTRL) and selected to be greater than the maximum stop time of the generator, or by detecting the stopping of the counter(s).

To form a generator of unclonable numbers of integrated circuit identifier type, the delay lines and the common ratio of the arithmetic sequences are sized to set the number of oscillations. The number is sampled after the stopping of the generator in the same way as for a random number generator and only part of the bits are preferably kept (the most significant).

Various embodiments have been described. Various alterations, modifications, and improvements will occur to those skilled in the art. In particular, the selection of the delays introduced by the symmetrical delay lines and of the shifts introduced by the asymmetrical delay elements depends on the application and on the specifications of the generator. Finally, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for counting pulses supplied by a source circuit having at least two inverted pulse signal supply terminals, comprising:
 a first counter configured to count pulses of a first pulse signal and supply a first count, wherein the first count is a value equal to a number of counted pulses of the first pulse signal;
 a second counter configured to count pulses of a second pulse signal and supply a second count, wherein the second count is a value equal to a number of counted pulses of the second pulse signal; and
 a selection circuit configured to select one of the first and second counts;
 wherein the selection circuit receives, in addition to the first and second counts supplied by the first and second counters, said first and second pulse signals.

2. The circuit of claim 1, wherein the selection circuit takes into account a disappearing of pulses in one of the first and second pulse signals.

3. The circuit of claim 1, wherein the selected one of the first and second counts is a count from one of the first and second counters having a pulse signal which stops first.

4. The circuit of claim 1, wherein the selected one of the first and second counts is a count from one of the first and second counters having a pulse signal which stops last.

5. The circuit of claim 1, wherein the selected one of the first and second counts is a count:
 of one of the first and second counters having a highest count if the first and second counts have a same parity; or
 of one of the first and second counters having a highest count if the highest count is even and a lowest count is odd.

6. The circuit of claim 1, wherein the selection circuit supplies a least significant bit of the selected one of the first and second counts.

7. A circuit for counting pulses supplied by a source circuit having at least two inverted pulse signal supply terminals, comprising:
 a first counter configured to count pulses of a first pulse signal and supply a first count, wherein the first count is a value equal to a number of counted pulses of the first pulse signal;
 a second counter configured to count pulses of a second pulse signal and supply a second count, wherein the second count is a value equal to a number of counted pulses of the second pulse signal; and a selection circuit configured to select one of the first and second counts;

wherein the source circuit for the pulses comprises two delay lines looped back on each other of an oscillation generator.

8. The circuit of claim 7, wherein the selected one of the first and second counts is a count from one of the first and second counters having a pulse signal which stops first.

9. The circuit of claim 7, wherein the selected one of the first and second counts is a count from one of the first and second counters having a pulse signal which stops last.

10. The circuit of claim 7, wherein the selected one of the first and second counts is a count:

of one of the first and second counters having a highest count if the first and second counts have a same parity; or of one of the first and second counters having a highest count if the highest count is even and a lowest count is odd.

11. The circuit of claim 7, wherein the selection circuit supplies a least significant bit of the selected one of the first and second counts.

12. A circuit for counting pulses supplied by a source circuit having at least two inverted pulse signal supply terminals, comprising:

a first counter configured to count pulses of a first pulse signal and supply a first count, wherein the first count is a value equal to a number of counted pulses of the first pulse signal;

a second counter configured to count pulses of a second pulse signal and supply a second count, wherein the second count is a value equal to a number of counted pulses of the second pulse signal;

a selection circuit configured to select one of the first and second counts; and a pulse shaping circuit located upstream of each first and second counter.

13. The circuit of claim 12, wherein the pulse shaping circuit comprises a flip-flop having an output looped back on an initialization or reset input after crossing a delay element.

14. The circuit of claim 13, wherein a delay introduced by the delay element is greater than a minimum time for the flip-flop to take a pulse into account.

15. A number generation circuit, comprising at least one circuit for counting pulses supplied by a source circuit having at least two inverted pulse signal supply terminals, said at least one circuit comprising:

a first counter configured to count pulses of a first pulse signal and supply a first count, wherein the first count is a value equal to a number of counted pulses of the first pulse signal;

a second counter configured to count pulses of a second pulse signal and supply a second count, wherein the second count is a value equal to a number of counted pulses of the second pulse signal; and a selection circuit configured to select one of the first and second counts; wherein the selection circuit receives, in addition to the first and second counts supplied by the first and second counters, said first and second pulse signals.

16. The circuit of claim 15, wherein the selection circuit takes into account a disappearing of pulses in one of the first and second pulse signals.

17. The circuit of claim 15, wherein the selected one of the first and second counts is a count from one of the first and second counters having a pulse signal which stops first.

18. The circuit of claim 15, wherein the selected one of the first and second counts is a count from one of the first and second counters having a pulse signal which stops last.

19. The circuit of claim 15, wherein the selected one of the first and second counts is a count:

of one of the first and second counters having a highest count if the first and second counts have a same parity; or of one of the first and second counters having a highest count if the highest count is even and a lowest count is odd.

20. The circuit of claim 15, wherein the selection circuit supplies a least significant bit of the selected one of the first and second counts.

21. A number generation circuit, comprising at least one circuit for counting pulses supplied by a source circuit having at least two inverted pulse signal supply terminals, said at least one circuit comprising:

a first counter configured to count pulses of a first pulse signal and supply a first count, wherein the first count is a value equal to a number of counted pulses of the first pulse signal;

a second counter configured to count pulses of a second pulse signal and supply a second count, wherein the second count is a value equal to a number of counted pulses of the second pulse signal; and a selection circuit configured to select one of the first and second counts;

wherein the source circuit for the pulses comprises two delay lines looped back on each other of an oscillation generator.

22. The circuit of claim 21, wherein the selected one of the first and second counts is a count from one of the first and second counters having a pulse signal which stops first.

23. The circuit of claim 21, wherein the selected one of the first and second counts is a count from one of the first and second counters having a pulse signal which stops last.

24. The circuit of claim 21, wherein the selected one of the first and second counts is a count:

of one of the first and second counters having a highest count if the first and second counts have a same parity; or of one of the first and second counters having a highest count if the highest count is even and a lowest count is odd.

25. The circuit of claim 21, wherein the selection circuit supplies a least significant bit of the selected one of the first and second counts.

26. A number generation circuit, comprising at least one circuit for counting pulses supplied by a source circuit having at least two inverted pulse signal supply terminals, said at least one circuit comprising:

a first counter configured to count pulses of a first pulse signal and supply a first count, wherein the first count is a value equal to a number of counted pulses of the first pulse signal;

a second counter configured to count pulses of a second pulse signal and supply a second count, wherein the second count is a value equal to a number of counted pulses of the second pulse signal;

a selection circuit configured to select one of the first and second counts; and a pulse shaping circuit located upstream of each first and second counter.

27. The circuit of claim 26, wherein the pulse shaping circuit comprises a flip-flop having an output looped back on an initialization or reset input after crossing a delay element.

28. The circuit of claim 27, wherein a delay introduced by the delay element is greater than a minimum time for the flip-flop to take a pulse into account.

* * * * *

UNITED STATES PATENT AND TRADEMARK OFFICE
CERTIFICATE OF CORRECTION

PATENT NO. : 10,243,543 B2
APPLICATION NO. : 15/358245
DATED : March 26, 2019
INVENTOR(S) : Jean Nicolai et al.

It is certified that error appears in the above-identified patent and that said Letters Patent is hereby corrected as shown below:

In the Specification

At Column 11, Line 67, please replace the equation:
[[$tr_{AZ} = tf_{AZ} = tr_{BZ} = tf_{BZ} = tr_A + tf_A + tr_B tf_B.$]]
With:
-- $tr_{AZ} = tf_{AZ} = tr_{BZ} = tf_{BZ} = tr_A + tf_A + tr_B + tf_B.$ --

Signed and Sealed this
Nineteenth Day of November, 2019

Andrei Iancu
*Director of the United States Patent and Trademark Office*